United States Patent [19]
Sung

[11] Patent Number: 5,965,920
[45] Date of Patent: Oct. 12, 1999

[54] INPUT PROTECTION CIRCUIT

[75] Inventor: Yang-Soo Sung, Inchon, Rep. of Korea

[73] Assignee: LG Semicon., Ltd., Cheongju, Rep. of Korea

[21] Appl. No.: 08/957,331

[22] Filed: Oct. 24, 1997

[30] Foreign Application Priority Data

Apr. 22, 1997 [KR] Rep. of Korea .................. 97/14967

[51] Int. Cl.⁶ .................. H01L 23/62; H01L 29/76; H01L 29/94
[52] U.S. Cl. .................. 257/355; 357/339; 357/361; 357/362
[58] Field of Search .................. 257/355, 339, 257/361, 362

[56] References Cited

U.S. PATENT DOCUMENTS

| | | | |
|---|---|---|---|
| 4,100,561 | 7/1978 | Ollendorf | 257/362 |
| 4,994,874 | 2/1991 | Shimizu et al. | 257/362 |
| 5,406,105 | 4/1995 | Lee | 257/355 |
| 5,432,368 | 7/1995 | Jimenez | 257/355 |
| 5,442,217 | 8/1995 | Mimoto | 257/361 |
| 5,576,557 | 11/1996 | Ker et al. | 257/361 |
| 5,594,265 | 1/1997 | Shimizu et al. | 257/355 |

*Primary Examiner*—Mahshid Saadat
*Assistant Examiner*—Jhihan B. Clark
*Attorney, Agent, or Firm*—Fleshner & Kim

[57] ABSTRACT

An input protection circuit which makes it possible to protect an internal circuit with respect to withstanding an electro-static charge by forming multiple discharge loops by connecting each input pad via an input protection circuit. The circuit includes a plurality of pads formed on a P well within a substrate, first discharge paths formed between neighboring pads, and a second discharge path formed between the pads and circuit ground.

15 Claims, 4 Drawing Sheets

INPUT PROTECTION CIRCUIT

BACKGROUND OF THE INVENTION

1. Field of the Invention

The present invention relates to an input protection circuit, and in particular to an improved electrostatic discharge (ESD) input protection circuit which is capable of effectively discharging an electrostatic charge in order to prevent damage to internal circuit elements in an integrated circuit.

2. Description of the Conventional Art

FIG. 1 illustrates a conventional input protection circuit, which, as shown therein, includes a pad 1 coupling an input signal to an internal circuit, and a bipolar NPN shunt transistor 2 connected to the signal path between the pad 1 and the internal circuit with the base thereof connected to receive a substrate voltage (VBB) and the emitter thereof connected to ground voltage (Vss).

FIG. 2 illustrates the physical layout of the input protection circuit of FIG. 1. As shown therein, a semiconductor substrate includes a p well forming the base of the bipolar NPN shunt transistor 2, and an n+ region forming the collector of the transistor 2 which is connected between the pad 1 and the internal circuit, and another n+ region forming the emitter of the transistor 2 which is connected with the ground voltage (Vss). A field oxide region (FOX) isolates the n+ collector and emitter regions and overlies the p-well.

The operation of the conventional input protection circuit will now be explained with reference to FIGS. 1 and 2.

When an electrostatic charge is inputted via the pad, a break-down phenomenon occurs between the n+ well forming the collector and the p well forming the base for thus increasing the amount of the electrostatic charge upon the p well. Therefore, the transistor becomes forward biased into conduction and the electro-static charge is discharged (shunted) through the p well and the (n+) collector region to ground (VSS).

However, in the conventional input protection circuit, since each pad has connected thereto an input protection circuit, so that the electro-static discharge path is made short, when a large electrostatic charge is inputted, it is impossible to properly discharge the electro-static charge.

SUMMARY OF THE INVENTION

Accordingly, it is an object of the present invention to provide an input protection circuit which overcomes the aforementioned problem encountered in the conventional art.

It is another object of the present invention to provide an improved input protection circuit which makes it possible to increase an internal capacitance encountered by an electrostatic charge by forming multiple discharge loops by connecting each pad via an input protection circuit.

To achieve the above objects, there is provided an input protection circuit according to a first embodiment of the present invention which includes a plurality of pads formed on a first conductive well in a substrate, a first discharge path formed between neighboring pads, and a second discharge path formed between the pads and circuit ground, wherein an electro-static charge applied through the pads is discharged through a diode connected in series between the first conductive well and a ground electrode.

To achieve the above objects, there is also provided an input protection circuit according to a second embodiment of the present invention which includes a first conductive well formed in a semiconductor substrate, a plurality of pads formed on the first conductive well, bipolar transistors formed between the neighboring pads, and a diode formed between the first conductive well and a ground electrode, wherein the diode is formed in the first conductive well and is formed through a ground electrode contacting with a second conductive well and the first conductive well.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
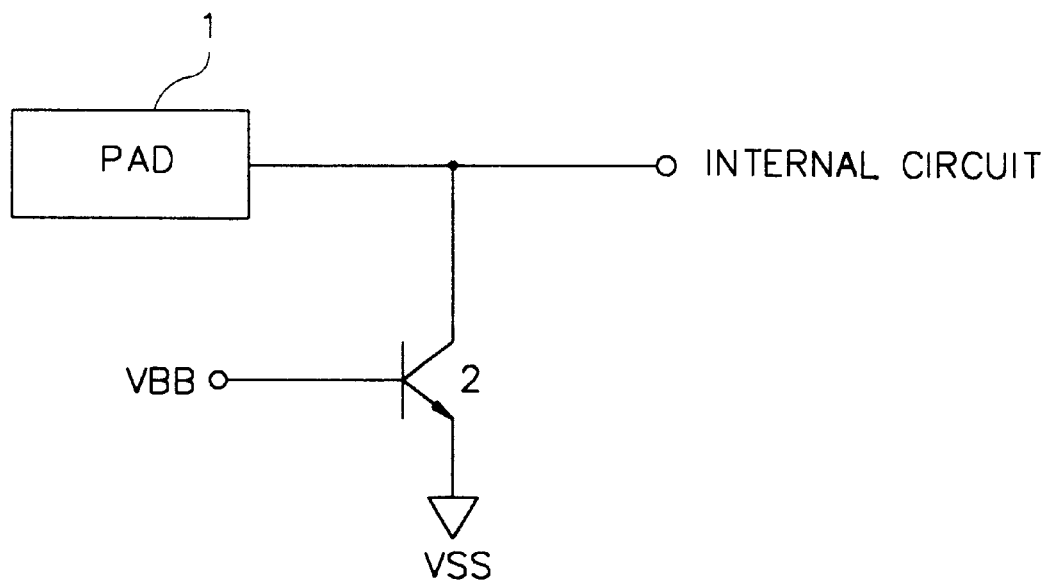
FIG. 1 is a circuit diagram illustrating a conventional input protection circuit.
Figure 2:
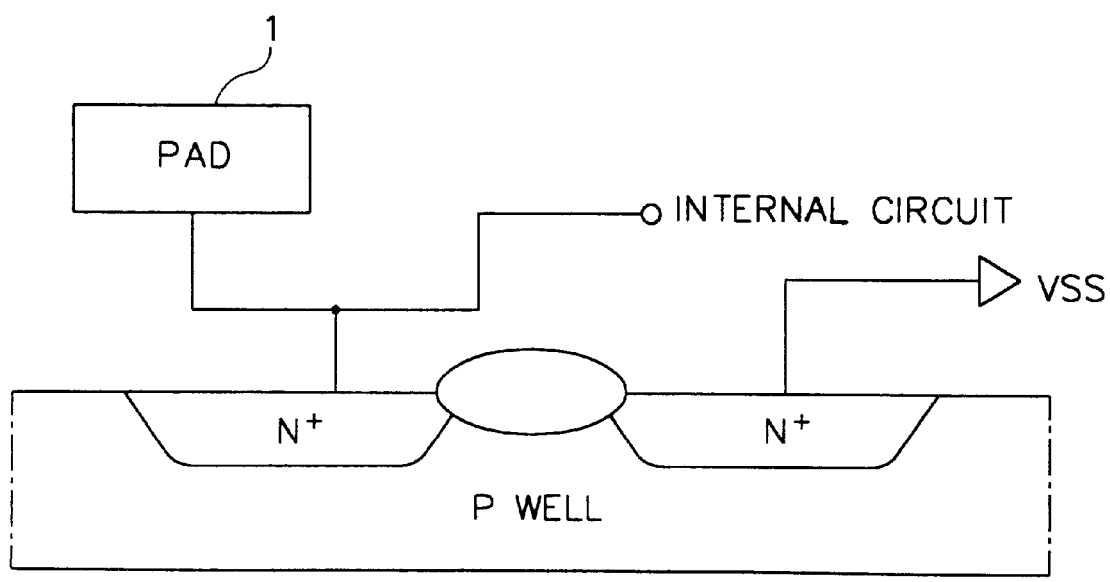
FIG. 2 is a diagram illustrating a physical layout of the input protection circuit of FIG. 1.
Figure 3:
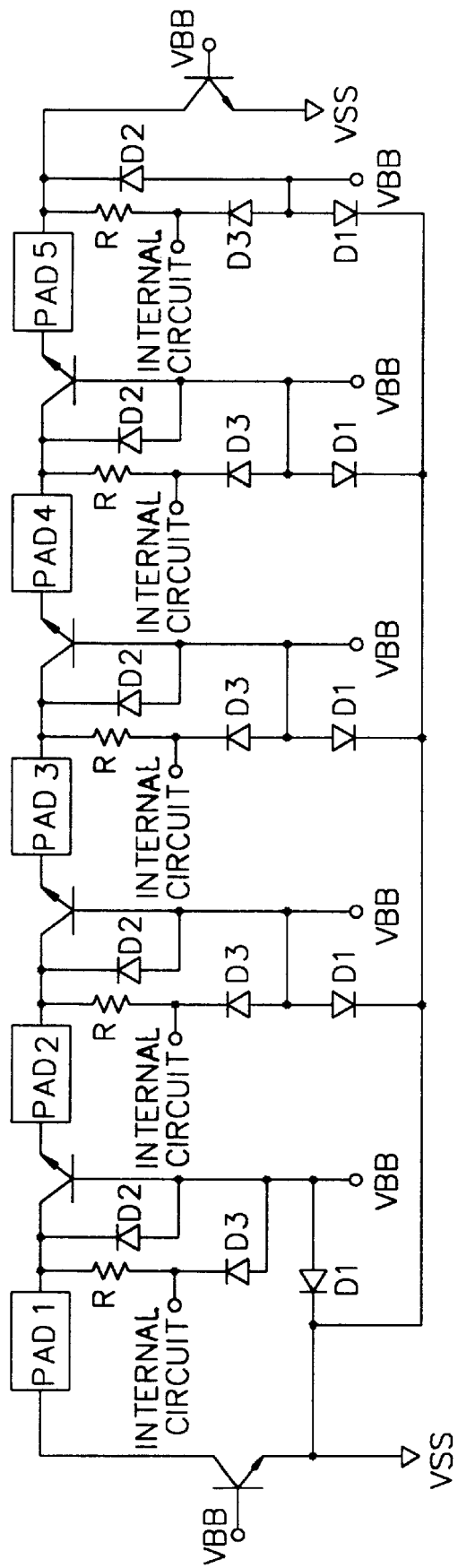
FIG. 3 is a schematic circuit diagram illustrating an input protection circuit according to the present invention.

FIG. 3 illustrates an input protection circuit according to the present invention.

As shown therein, a plurality of pads PAD1 through PAD5 are connected to each other through respective NPN bipolar transistors $Q_A$, and the base of each bipolar transistor $Q_B$ is connected to ground voltage (Vss) through a substrate voltage (VBB) line and a diode D1.

At one end of the input protection circuit according to the present invention, there is provided a bipolar transistor $Q_{B1}$ the collector of which is connected to the pad 1, the base thereof is connected with the substrate voltage (VBB), and the emitter thereof is connected with the ground voltage VSS. At the other end of the input protection circuit, a bipolar transistor $Q_{B2}$ is provided having its collector connected with the pad 5, the base thereof is connected with the substrate voltage (VBB), and the emitter thereof is connected with the ground voltage VSS.

In addition, a diode D2 which forms a discharge path is connected in parallel between each pad and the base of each of the bipolar transistors $Q_A$. A resistor R and a diode D3 in series are connected in parallel between each pad and the base of each of the transistors $Q_A$, and an internal circuit is connected to the common connection node.

Figure 4:
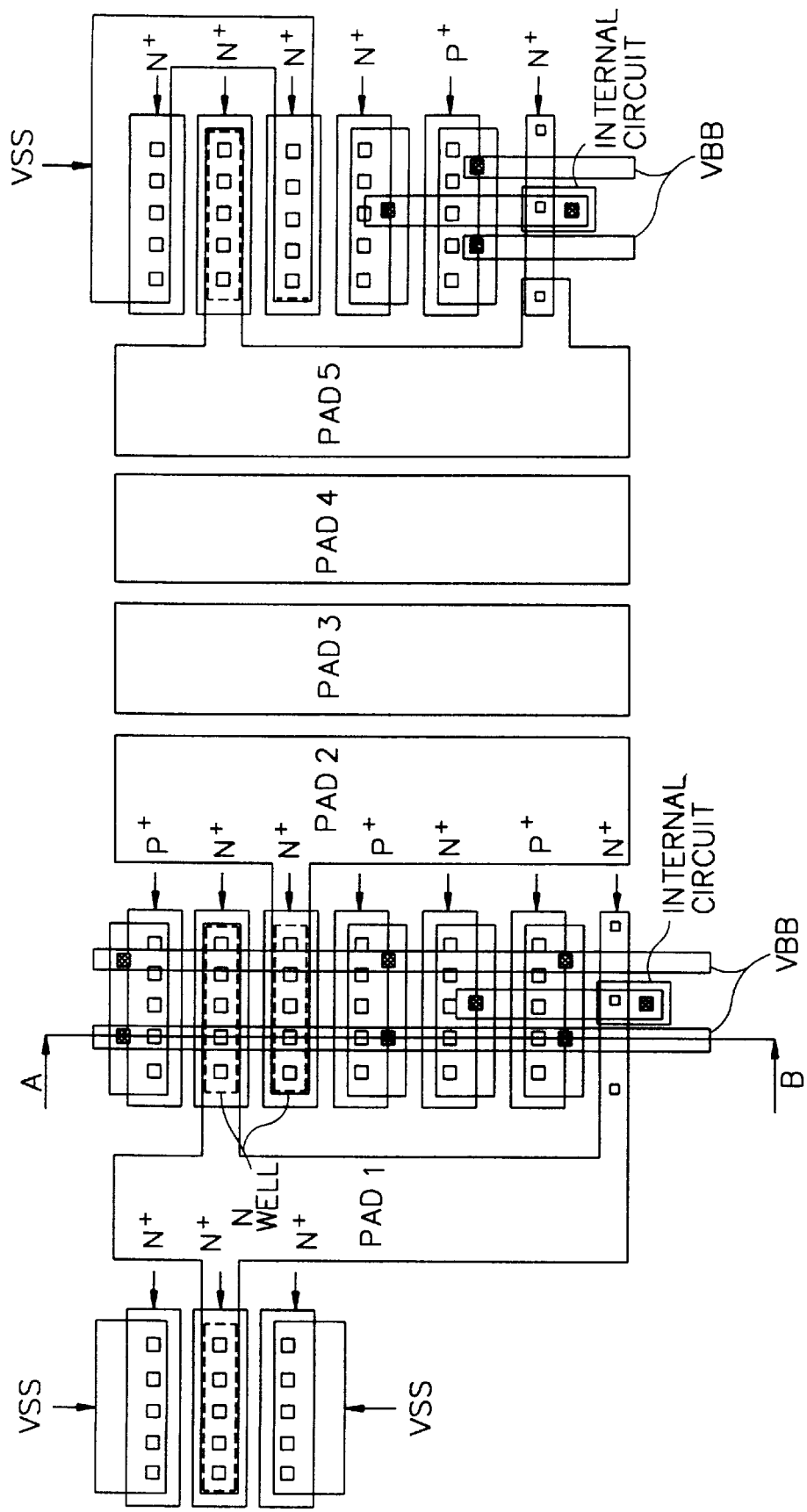
FIG. 4 is a plan view illustrating a physical layout of the circuit of FIG. 3.
Figure 5:
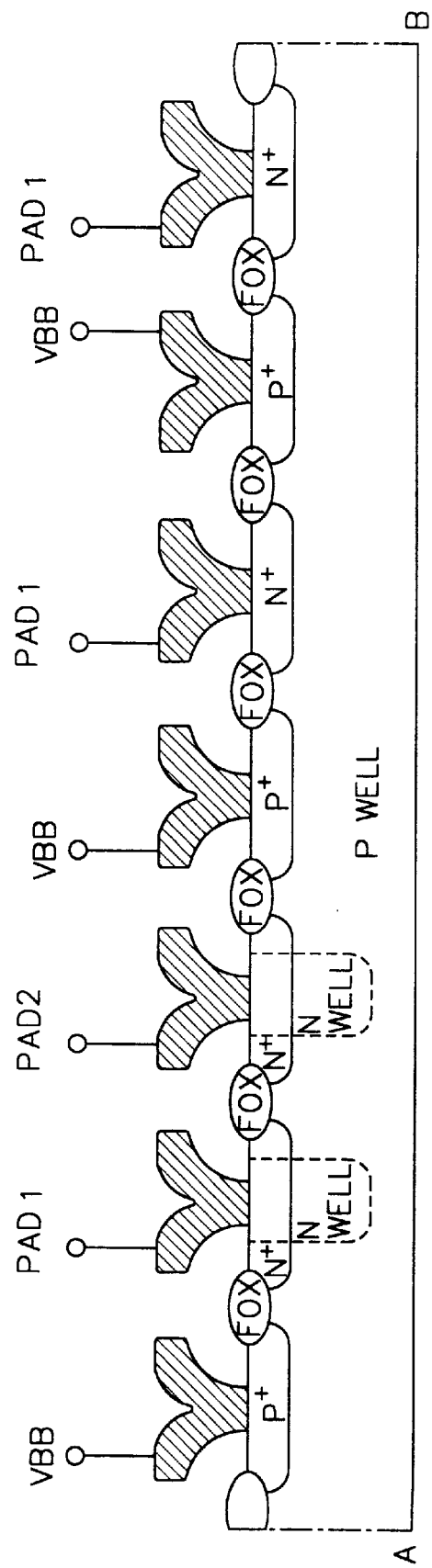
FIG. 5 is a cross-sectional view taken along line A–B in FIG. 4 illustrating the input protection circuit element of FIG. 4.

FIG. 4 illustrates a chip layout of the input protection circuit of FIG. 3 according to the present invention, and FIG. 5 illustrates a cross-sectional view taken along A–B in FIG. 4.

An n+ region which is used to form the resistor R is formed between the pad 1 and pad 2 such that a metal film is processed for thus trimming the resistance value, and an n well is formed in the n+ region such that a junction capacitance is decreased.

In addition, a p+ region connected to receive the substrate bias voltage (VBB) is formed around each pad, so that electro-static charge transmitted from the n+ region to the n well is easily transferred to the p+ region. The layout of the circuit is arranged such that the total junction capacitance generated is below 2 pf.

The operation of the input protection circuit according to the present invention will now be explained with reference to the accompanying drawings.

First, when an electro-static charge is inputted into the n+ region via the pad 1, the electro-static charge is transferred into the p well by a breakdown phenomenon between the n+ and p well regions, and the electro-static charge transferred into the p well is discharged through the substrate bias voltage (VBB) line via the p+ region, and then is transferred to the pad 2 through the neighboring n+ region. At this time, the electrostatic charge discharged through the substrate bias voltage (VBB) line via the p+ region is discharged through the VSS line.

In addition, a part of the electrostatic charge transferred to the pad 2 is discharged through the substrate bias voltage (VBB) line in the same manner as above described, and another part of the electro-static charge is discharged through the neighboring pad 3.

Therefore, the electro-static charge transmitted to the pad of the last unit is finally discharged through the n+ region connected to the Vss line.

In the present invention, the final discharge path is formed to be connected with the VSS line. More preferably, it is possible to form the final discharge path by using the VCC line. In addition, in the case that the electro-static charge discharged through the VSS line is in the VCC ground state, the VSS-VCC discharge path may be combined for more easily enabling the electro-static charge discharging operation.

As described above, the input protection circuit is capable of increasing the internal capacitance encountered by the electrostatic charge by connecting each of input pads through input protection circuits and forming multiple discharge loops.

In addition, in the present invention, the electrostatic charge is discharged through the bipolar transistor connecting the pads and discharging the same through the substrate bias voltage (VBB) line, thereby decreasing build-up of the electrostatic charge.

Furthermore, it is possible to decrease the junction capacitance by forming the n well at an inner portion of the n+ region.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. An input protection circuit, comprising:
    a plurality of pads formed on a first conductive well in a substrate;
    first discharge paths formed between neighboring ones of the pads; and
    a second discharge path formed between the pads and a ground voltage, wherein an electro-static charge applied through said pads is discharged through a diode connected in series between said first conductive well and a ground electrode.

2. The circuit of claim 1, wherein said pads are each connected to a corresponding n+ region formed in the p well of the substrate.

3. The circuit of claim 1, wherein said first discharge paths are each formed via a bipolar transistor formed between the neighboring pads.

4. The circuit of claim 1, wherein said first conductive well is a p-type well.

5. The circuit of claim 2, wherein each said n+ region includes an n well formed in an inner portion thereof and made to be deeper than the n+ region for thus decreasing a junction capacitance.

6. The circuit of claim 3, wherein in the bipolar transistor, a substrate voltage electrode is connected through a p+ region formed in the first conductive well serving as a base electrode, and a collector region and emitter region are connected to corresponding pads, respectively.

7. The circuit of claim 6, wherein said collector region and emitter region are formed extending in parallel from the pads and are intersected by a substrate voltage line which perpendicularly crosses thereto and by an insulation layer.

8. The circuit of claim 7, wherein said diode includes a p+ region and n+ region formed in the p well formed in the substrate, and the ground electrode is connected to the n+ region.

9. The circuit of claim 7, wherein said diode is connected with the ground electrode via a second n+ region formed parallely with the first n+ region formed in the p well and connected to the pad and is formed between the p well and the second n+ region.

10. An input protection circuit, comprising:
    a first conductive well formed in a semiconductor substrate;
    a plurality of pads formed on the first conductive well;
    bipolar transistors formed between the neighboring pads; and
    a diode formed between the first conductive well and a ground electrode, wherein said diode is formed in said first conductive well and is formed through a ground electrode contacting with a second conductive well and said first conductive well.

11. The circuit of claim 10, wherein said first conductive well is a p well.

12. The circuit of claim 10, wherein said pad is formed in the first conductive well and contacts with the second conductive well which is of opposite conductivity type to the first conductive well.

13. The circuit of claim 10, wherein in said bipolar transistors, a base region is connected to a substrate voltage electrode, and the pads are connected to a collector region and emitter region.

14. The circuit of claim 12, wherein when said first conductive well is a p type, the second conductive well is an n type, and when the first conductive well is an n type, the second conductive well is a p type.

15. The circuit of claim 12, wherein when said first conductive well is a p type, the second conductive well is an n type, and when the first conductive well is an n type, the second conductive well is a p type.

* * * * *

UNITED STATES PATENT AND TRADEMARK OFFICE
CERTIFICATE OF CORRECTION

PATENT NO : 5,965,920
DATED : October 12, 1999
INVENTOR(S): Sung

It is certified that error appears in the above-identified patent and that said Letters Patent is hereby corrected as shown below:

On the cover page at [73] Assignee change:

"LG Semicon., Ltd." to --LG Semicon Co., Ltd.--

Signed and Sealed this

Eleventh Day of April, 2000

Attest:

Q. TODD DICKINSON

Attesting Officer

Director of Patents and Trademarks